United States Patent
Murin et al.

(10) Patent No.: US 7,825,734 B2
(45) Date of Patent: Nov. 2, 2010

(54) AMPLIFIER HAVING AN OUTPUT PROTECTION, IN PARTICULAR OPERATIONAL AMPLIFIER FOR AUDIO APPLICATION

(75) Inventors: Peter Murin, Poltar (SK); Hynek Saman, Beroun (CZ)

(73) Assignee: STMicroelectronics Design and Application s.r.o., Prague (CZ)

( * ) Notice: Subject to any disclaimer, the term of this patent is extended or adjusted under 35 U.S.C. 154(b) by 197 days.

(21) Appl. No.: 12/062,576

(22) Filed: Apr. 4, 2008
(Under 37 CFR 1.47)

(65) Prior Publication Data

US 2009/0102561 A1 Apr. 23, 2009

(30) Foreign Application Priority Data

Apr. 6, 2007 (EP) .................................. 07105835

(51) Int. Cl.
*H03F 1/52* (2006.01)
(52) U.S. Cl. ...................................... 330/298; 330/290
(58) Field of Classification Search .................. 330/85, 330/207 P, 290, 298
See application file for complete search history.

(56) References Cited

U.S. PATENT DOCUMENTS 4,714,898 A * 12/1987 Botti et al. .................. 330/298

| 5,162,749 | A | 11/1992 | Kobayashi | |
|---|---|---|---|---|
| 5,739,712 | A * | 4/1998 | Fujii | 327/323 |
| 5,905,617 | A | 5/1999 | Kawasoe | |
| 6,218,900 | B1 | 4/2001 | Nolan | |

OTHER PUBLICATIONS

European Search Report from corresponding European Application No. 07105835.8, filed Apr. 6, 2007; Date of Search Report Jul. 26, 2007.

* cited by examiner

*Primary Examiner*—Steven J Mottola
(74) *Attorney, Agent, or Firm*—Lisa K. Jorgenson; James H. Morris; Wolf, Greenfield & Sacks, P.C.

(57) ABSTRACT

An amplifier with an output protection having an input stage defining a feedback node, an output stage connected to the feedback node and defining an output node supplying an output voltage, and a feedback stage connected between the output and the feedback nodes. A mirror stage is connected to the feedback node and has the same structure as the output stage, the mirror stage defining a reference node connected to the feedback stage for generating a reference voltage to be compared to the output voltage by the feedback stage. The feedback stage generates a current limitation signal fed to the feedback node when a difference between the output and the reference voltages is higher than a threshold.

17 Claims, 5 Drawing Sheets

AMPLIFIER HAVING AN OUTPUT PROTECTION, IN PARTICULAR OPERATIONAL AMPLIFIER FOR AUDIO APPLICATION

BACKGROUND OF THE INVENTION

1. Field of the Invention

The present invention relates to an amplifier having output protection, in particular to an operational amplifier for audio application.

2. Discussion of the Related Art

As known, in audio systems, it is necessary to avoid destruction of the power output transistors of operational amplifiers. In particular, the operational amplifiers are to be protected when connected to loads having excessively low resistance, in particular in order to avoid the occurrence of short-circuits on the output stage of the operational amplifier, the schematic circuit whereof is shown in FIG. 1.

To this end, prior art protection circuits senses the output current $I_{OUT}$ flowing to the load $R_L$. When the sensed current $I_{OUT}$ exceeds a reference value, a feedback circuit decreases the gain of the operational amplifier OPAMP. In practice, the prior art protection circuits provide a characteristic of the output current $I_{OUT}$ versus the load $R_L$ as shown in FIG. 2, wherein the output current $I_{OUT}$ has a constant value $I_{MAX}$ when the load is lower than a minimum value $R_{Lmin}$, and is inversely proportional to the output load, when the load is higher than the minimum value $R_{Lmin}$.

With the known solutions, there exists the problem that the circuit delivers a high output current when the protection circuit is active, thereby causing high power dissipation or even the destruction of the amplifier due to the heat.

SUMMARY OF THE INVENTION

An object of the invention is to provide a protection circuit involving a lower power dissipation.

According to one embodiment of the present invention, there is provided an amplifier having an output protection, comprising an input stage defining a feedback node, an output stage connected to the feedback node and defining an output node supplying an output voltage, and a feedback stage connected between the output nodes, a mirror stage connected to the feedback node having a same structure as the output stage, the mirror stage defining a reference node connected to the feedback stage for generating a reference voltage to be compared to the output voltage by the feedback stage, the feedback stage generating a current limitation signal fed to said feedback node when a difference between the output and the reference voltages is higher than a threshold.

BRIEF DESCRIPTION OF THE DRAWINGS

For understanding of the present invention, a preferred embodiment is now described, purely as a non-limitative example, with reference to the enclosed drawings, wherein.

DETAILED DESCRIPTION

According to an embodiment, when the output load $R_L$ becomes lower than a reference (minimum) value $R_{Lmin}$, for example when the output load is short-circuited to a reference voltage (ground or other reference value), a protection circuit intervenes and abruptly reduces the output current $I_{OUT}$ to a very low value, ideally to zero. Thereby, a low power dissipation is obtained.

Figure 4:
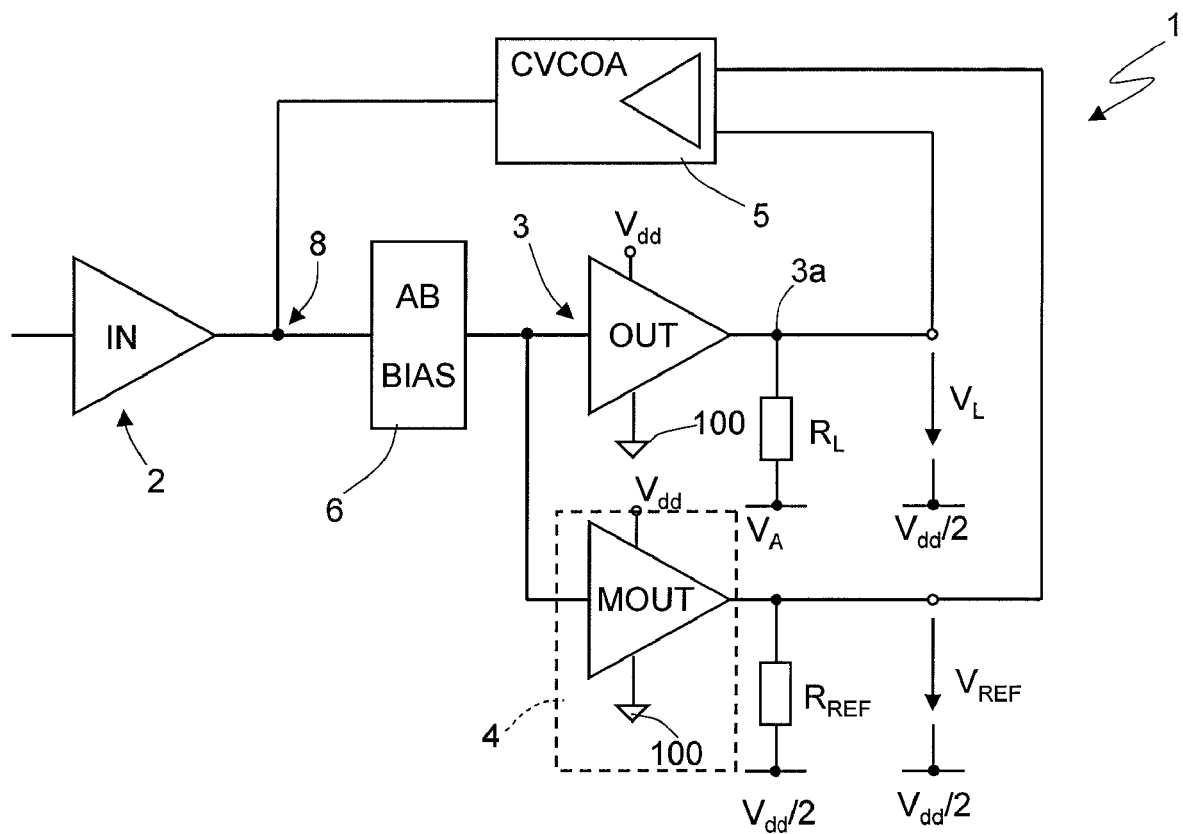
FIG. 4 shows a block diagram of an operational amplifier according to an embodiment of the amplifier of FIG. 4.

To this end, according to FIG. 4, an operational amplifier 1 comprises an input stage 2, an intermediate stage 6, an output stage 3, a mirror stage 4 and a feedback stage 5.

Figure 1:
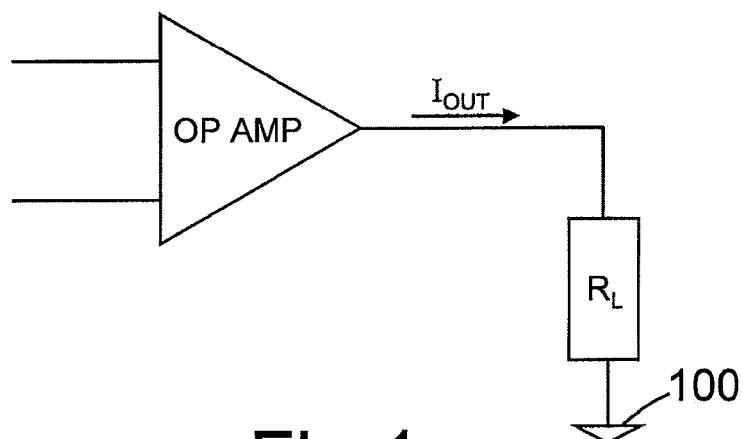
FIG. 1 illustrates a block diagram of a known operational amplifier.
Figure 2:
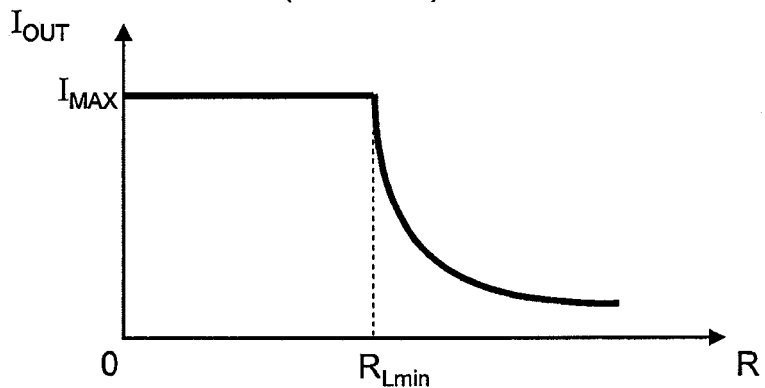
FIG. 2 shows the characteristic output current vs. load resistance of an operational amplifier with known protection circuit.
Figure 3:
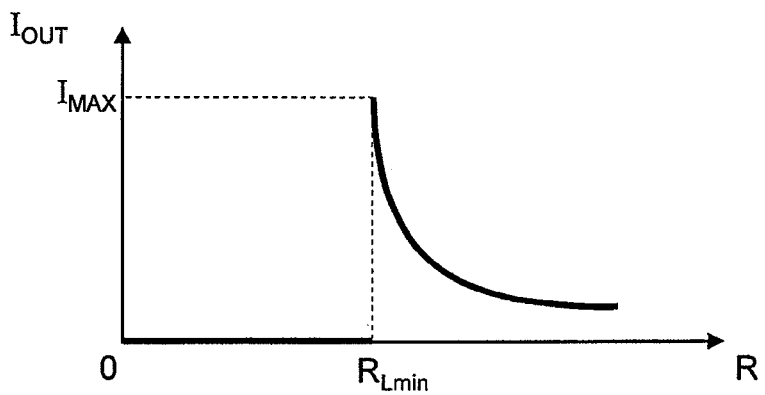
FIG. 3 shows a desired characteristic output current vs. load R of an operational amplifier.
Figure 6:
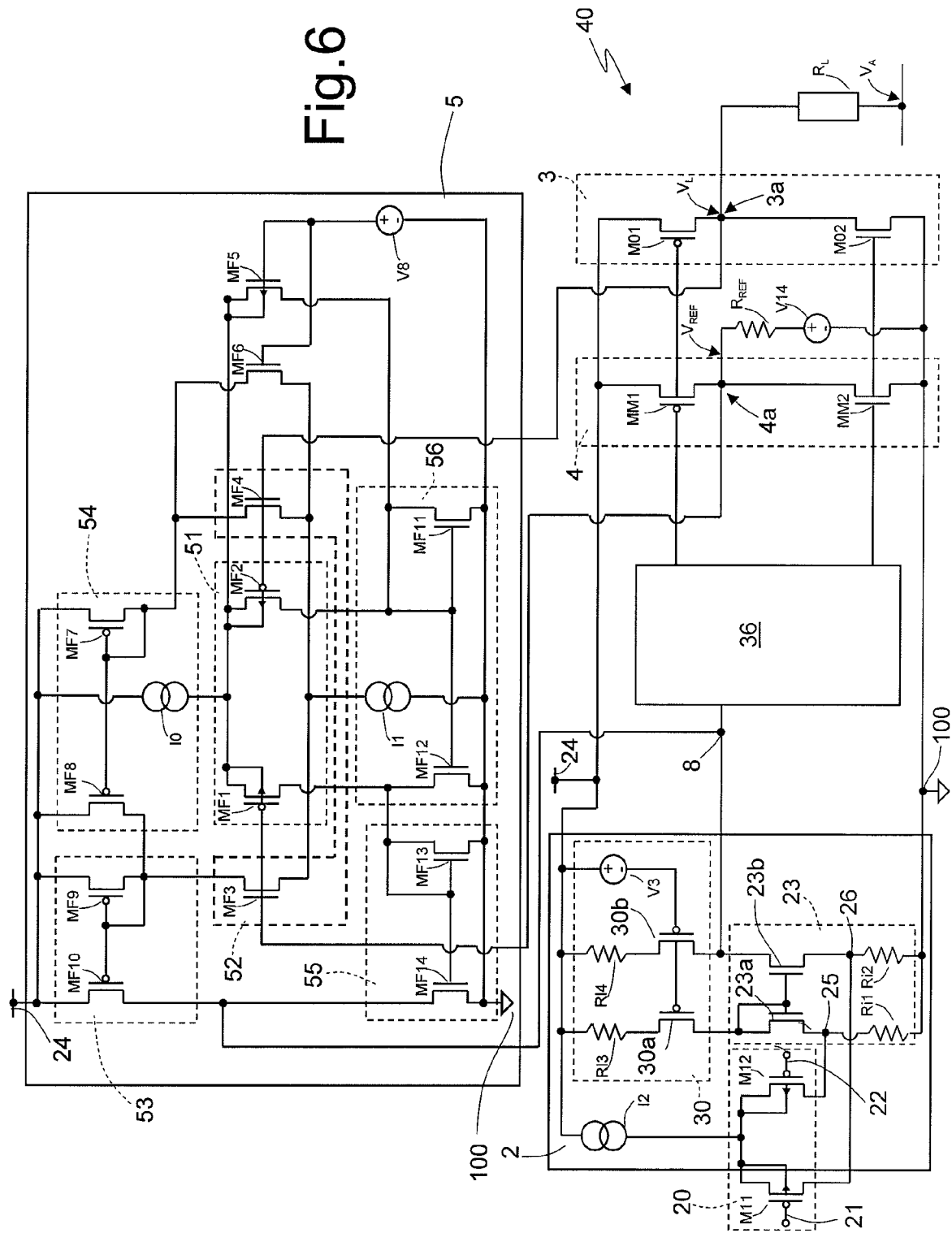
FIG. 6 show a detailed circuit diagram of an embodiment of the invention.

The input stage 2 is a conventional differential stage with folded-cascode, as shown for example in FIG. 6, and has an output defining a feedback node 8 connected to the input of the intermediate stage 6. The intermediate stage 6 is a standard gain and biasing circuit for class AB amplifiers and is connected to the input of both the output stage 3 and the mirror stage 4. The output stage 3 and the mirror stage 4 have the same structure and are each connected to its own load $R_L$ and, respectively, $R_{REF}$. In particular, circuit load $R_L$ is connected between output node 3a of output stage 3 and a reference voltage $V_A$ here equal to Vdd/2; reference load $R_{REF}$ is connected between output node 4a of mirror stage 4 and the reference voltage $V_A$. The value of the reference load $R_{REF}$ is typically designed to represent the reference (minimum) value $R_{Lmin}$ of FIG. 3.

The output nodes 3a, 4a of the output and mirror stages 3, 4 are also connected to inputs of the feedback stage 5, whose output is connected to the feedback node 8. The feedback stage 5 is a differential circuit, in this embodiment a common voltage controlled operational amplifier (in the following, also indicated as CVCOA).

In use, the mirror stage 4 generates a reference voltage $V_{REF}$ which is compared with an output voltage $V_L$ on the circuit load $R_L$ by the feedback stage 5; if no fault condition exists, the absolute value $|V_L|$ of the output voltage $V_L$ is higher than the absolute value of the reference voltage $V_{REF}$ ($|V_L|>|V_{REF}|$) and the feedback stage 5 does not supply any biasing current to the feedback node 8, causing a standard operation of the operational amplifier 1.

If the circuit load $R_L$ is too low, e.g. due to a short-circuit, the absolute value of the output voltage $V_L$ drops below the absolute value of the reference voltage $V_{REF}$, thereby the difference between the absolute values of the output voltage $V_L$ and the reference voltage $V_{REF}$ is negative (Vd=$|V_L|-|V_{REF}|<0$), and the feedback circuit 5 intervenes by feeding the feedback node 8 with a linear signal which has an opposite sign to the signal fed by input stage 2. Thus, the current through the circuit load $R_L$ is reduced, thus preventing the destruction of the operational amplifier 1.

Figure 5:
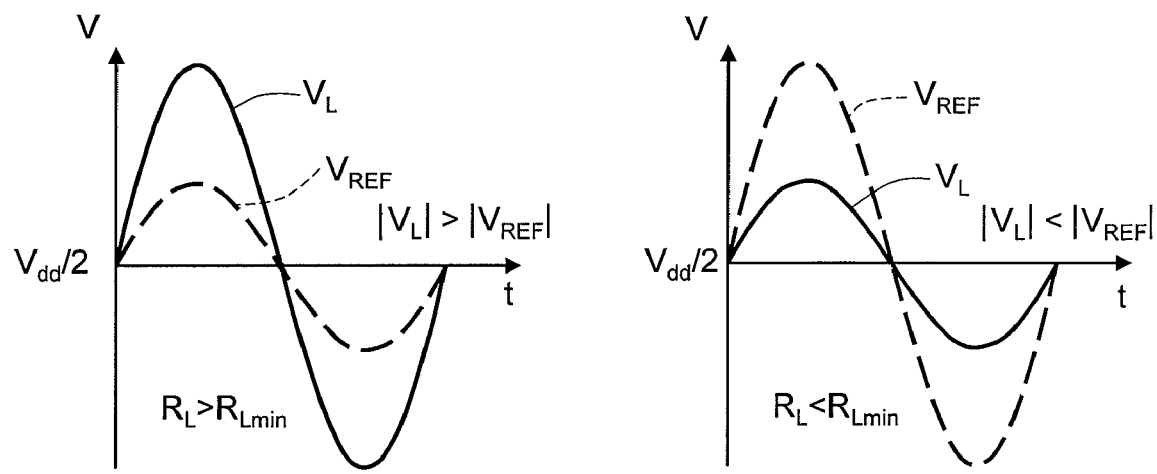
FIGS. 5a and 5b show the plot of the output voltage vs. time obtainable with the amplifier of FIG. 4, in two different operative conditions.

An example of the waveforms obtainable with the operational amplifier 1 of FIG. 4 is shown in FIGS. 5a and 5b in case of correct operation (when the load resistance $R_L$ is higher than reference resistance, $R_L>R_{REF}$) and of fault condition ($R_L<R_{REF}$), respectively.

An embodiment of the operational amplifier 1 shown in FIG. 4 is shown in FIG. 6.

The operational input stage 2 comprises a first input differential stage 20 having input pins 21 and 22 receiving an input signal.

The first input differential stage 20 is formed by two MOS transistors MI1, MI2 of a first conductivity type, here PMOS, which are coupled between a reference potential line 24 at Vdd and respective input intermediate nodes 25 and 26.

In detail, the input stage 2, comprises an input differential pair 20, an input mirror stage 23 and a biasing stage 30 connected between the reference potential line 24 and a ground line 100.

The input mirror stage 23 comprises two identical transistors 23a, 23b, of the same conductivity type, and two resistors Ri1, Ri2. In the embodiment shown in FIG. 6, transistors 23a, 23b are of the MOS type of a second conductivity type, here NMOS. The input mirror stage 23 together with input differential pair 20 represents a folded cascode circuit.

The input stage 2 of the operational amplifier 1 also comprises a biasing stage 30. The biasing stage 30 comprises two MOS transistors 30a, 30b of the first conductivity type, here PMOS, two resistors Ri3 and Ri4 and a biasing voltage source V3. The biasing stage 30 is electrically connected between the input mirror stage 23 and the reference potential line 24. Gate electrodes of the MOS transistors 30a, 30b are electrically connected to a biasing voltage source V3; MOS transistor 30b has a drain connected to the drain of transistor 23b at to the feedback node 8.

The input stage 2 also comprises a DC current source I2 connected between the source terminals of the first input differential stage 20 and the reference potential line 24.

An intermediate stage 36 (in the embodiment, an AB class biasing circuit, well known in the art) is connected to a reference potential line 24, the ground line 100 and the feedback node 8 and acts as an interface between the input stage 2 of the operational amplifier 1 and an output stage 40, including both stages 3 and 4 of FIG. 4. The intermediate stage 36 generates biasing signals for the transistors of the output stage 40, whose value depends upon the resistance of the potentially harmful output loads $R_L$, as described in greater detail hereinafter.

The output stage 3 comprises two MOS transistors MO1 and MO2 connected as a push-pull circuit and biased so as to form an AB class amplifier. In the embodiment shown in FIG. 6, transistor MO1 is a PMOS transistor and transistor MO2 is an NMOS transistor; they are connected at an output node 3a.

The mirror stage 4 is formed by transistors MM1 and MM2, that are connected at output node 4a and generate mirror currents correlated, and specifically equal, to the currents flowing through transistors MO1 and MO2. Output stage 4 also comprises a voltage biasing source V14 connected in series with reference load between the ground line 100 and an intermediate node 4a. In the instant embodiment, the voltage magnitude of the source V14 is $V_A=Vdd/2$, so the reference load $R_{REF}$ and output load $R_L$ are both referred to the same potential (here Vdd/2).

The transistors MM1 and MM2 have an aspect ratio W/L, that is the ratio between the width and the length of the MOS channel, that is lower than the aspect ratio of transistors MO1 and MO2. For example, the aspect ratio W/L of transistors MM1 and MM2 may be 1000 times lower than the aspect ratio of transistors MO1 and MO2. Thereby, the current flowing into the reference load $R_{REF}$ is 1000 times lower than the current flowing through the output load $R_L$. In order to maintain the same voltage drop on the resistors $R_L$ and $R_{REF}$, $R_{REF}=1000\,R_L$.

A high difference between the above mentioned aspect ratios is advantageous, since it reduces the power dissipated in the reference load $R_{REF}$, consequently reducing the heat generated during the circuit operation.

Furthermore, transistors MO1 and MM1 have an higher aspect ratio than MO2 and, respectively, MM2, namely three or four times, so as to obtain the same conductivity in PMOS and NMOS transistors.

In FIG. 6, the feedback circuit 5 is a common voltage controlled operational amplifier (CVCOA), which decreases the gain of the operational amplifier 1 by increasing the gain of the feedback stage 5 (acting as a negative feedback stage) when the output load $R_L$ assumes potentially harmful values ($R_L < R_{Lmin}$).

The feedback circuit 5 is substantially formed by two feedback differential stages 51, 52 which are activated alternatively in dependence on the voltage on the nodes 4a and 3a.

The first feedback differential stage 51 comprises input MOS transistors MF1 and MF2, of the first conductivity type, here PMOS having gate terminals connected to node 4a and 3a respectively. The second differential stage 52 of the feedback circuit 5 comprises MOS transistors MF3 and MF4, of the second conductivity type, here NMOS having gate terminals connected to node 4a and 3a respectively.

The first differential stage 51 drives an output MOS transistor MF14 and the second differential stage 52 drives an output MOS transistor MF10. Output MOS transistors MF14 and MF10 are connected in series between a reference potential line 24 and ground line 100 and have an intermediate node connected to feedback node 8.

MOS transistor MF10 forms, together with a transistor MF9, a first feedback mirror 53 which is connected to a second feedback mirror 54 formed by MOS transistors MF7, MF8; MOS transistor MF14 forms together with a MOS transistor MF13, a third feedback mirror 55 which is connected to a fourth feedback mirror 56 formed by MOS transistors MF11, MF12. The second feedback mirror 54 is connected to the second differential stage 52 and to a spill-over MOS transistor MF6 (of the second conductivity type, here NMOS); the fourth feedback mirror 56 is connected to a second spill-over MOS MF5 (here, of the first conductivity type) connected to the first differential stage 51. MOS transistors MF7, MF8 and MF9, MF10 are here of the first conductivity type, and MOS transistors MF11, MF12 and MF13, MF14 are of the second conductivity type. The two current mirrors 53 and 54 have own MOS sources connected to the reference potential line Vdd, while the current mirrors 55 and 56 have own MOS sources connected to the ground line 100.

A voltage source V8 is connected to the gates of MOS transistors MF5 and MF6 and generates biasing voltage $V_A=Vdd/2$.

The feedback circuit 5 includes two DC current sources I0 and I1 supplying the feedback circuit 5.

In the embodiment of FIG. 6, MOS transistors MF7 and MF8 have a same aspect ratio $(W/L)_7=(W/L)_8=K$, thus:

$$M_{54} = \frac{\left(\frac{W}{L}\right)_7}{\left(\frac{W}{L}\right)_8} = 1 \tag{1}$$

whereas ratios $M_{53}$, $M_{54}$, $M_{55}$, $M_{56}$ of the current mirrors 54, 55 and 56 are 1:2, 1:1, 1:2 and 1:1 respectively.

Furthermore, transistor MF3 and MF4 have the same aspect ratio which is about three times the aspect ratio of MF1 and MF2 in order to keep the same transconductance of differential stages 51 and 52; transistors MF5 and MF6 have the same aspect ratio which is the double of the aspect ratio of transistor MF3 and MF1. In addition the aspect ratio of transistor MF6 is the double of the aspect ratio of transistor MF4; transistor MF5 has an aspect ratio which is the double of the aspect ratio of transistor MF2; transistors MF7 and MF8 have the same aspect ratio.

In use, the operational amplifier 1 operates as follows.

When the reference voltage $V_{REF}$ on node 4a is equal to the output voltage $V_L$ on node 3a, the first and the second feedback differential stages 51, 52 are balanced; thus MOS transistors MF3 and MF8 conduct the same current and the drain currents of transistors MF9 and MF10 are equal to zero; thus also MOS transistors MF11 and MF12 conduct the same current and the drain currents of transistors MF13 and MF14 are equal to zero.

In detail, when the reference voltage is equal to the output voltage ($V_L=V_{REF}$), the drain current of transistor MF3 is equal to the drain current of transistor MF4. Due to the reciprocal connection of transistor MF4 and transistor MF7 and neglecting the conductivity of transistor MF6, also the drain current of transistor MF7 is equal to the drain current flowing in transistor MF3. The MOS transistors MF8 and MF7, connected in a mirroring configuration, force the drain current of MF8 to be equal to the drain current of transistor MF4 and MF3. Thus:

$$I_D(MF9)=I_D(MF3)-I_D(MF8)=0 \quad (2)$$

wherein $I_D(MF9)$, $I_D(MF3)$ and $I_D(MF8)$ are the drain currents of transistors MF9, MF3 and MF8, respectively.

Since the condition $V_L=V_{REF}$ implies that the drain currents of transistor MF3 and transistor MF8 are equal in value, the drain current of transistor MF9, mirrored to the MOS transistor MF10, is equal to zero.

Analogously, when the reference voltage $V_{REF}$ is equal to the output voltage $V_L$, the drain current of transistor MF1 is equal to the drain current of transistor MF2. Due to the reciprocal connection of transistor MF2 and transistor MF11 and neglecting the conductivity of transistor MF5, also the drain current of transistor MF11 is equal to the drain current flowing in transistor MF2. The MOS transistors MF12 and MF11, connected in a mirror configuration, force the drain current of MF12 to be equal to the drain current of transistor MF2 and MF1. Thus:

$$I_D(MF13)=I_D(MF1)-I_D(MF12)=0 \quad (3)$$

wherein $I_D(MF13)$, $I_D(MF1)$ and $I_D(MF12)$ are the drain currents of transistors MF13, MF1 and MF12, respectively.

Since the condition $V_L=V_{REF}$ implies that the drain currents of transistor MF1 and transistor MF12 are equal in value, the drain current of transistor MF13, mirrored to the MOS transistor MF14, is equal to zero.

The feedback circuit 5 thus does not interfere with the operation of the input stage 2.

For the differential stage 52, if the output voltage $V_L$ is lower than the reference voltage $V_{REF}$ ($V_L<V_{REF}$), neglecting initially transistor MF6, the current through transistor MF3 is higher than the current flowing through transistors MF4, MF7 and thus MF8; therefore the drain current of transistors MF9 and MF10, $I_D(MF9),I_D(MF10)$ are different from zero. Due to the presence of transistor MF6, as long as $V_{REF}<Vdd/2$ and $V_L<Vdd/2$, transistor MF8 is able to supply all the current supplied by transistor MF3; thus drain currents of transistors MF9 and MF10 are equal to zero.

If the output voltage $V_L$ is higher than the reference voltage $V_{REF}$ ($V_L>V_{REF}$), $V_{REF}>Vdd/2$ and $V_L>Vdd/2$, the current flowing through transistor MF4 is higher than the current flowing through transistor MF3, thus again the drain currents of transistors MF9 and MF10 are equal to zero.

As the differential stage 51, in the same conditions described above, if the output voltage $V_L$ is higher than the reference voltage $V_{REF}$ ($V_L>V_{REF}$), neglecting initially transistor MF5, the current through transistor MF1 is higher than the current flowing through transistors MF2, MF11 and thus MF12; therefore the drain currents $I_D(MF13),I_D(MF14)$ of transistors MF13 and MF14 are different from zero.

However, due to the presence of transistor MF5, as long as $V_{REF}>Vdd/2$ and $V_L>Vdd/2$, transistor MF12 is able to supply all the current flowing through by transistor MF1; thus drain currents of transistors MF13 and MF14 are equal to zero.

If the output voltage $V_L$ is lower than the reference voltage $V_{REF}$ ($V_L<V_{REF}$), $V_{REF}<Vdd/2$ and $V_L<Vdd/2$, the current flowing through transistor MF2 is higher than the current flowing through transistor MF1, thus again the drain currents of transistors MF13 and MF14 are equal to zero.

From the above, it follows that the drain current delivered by transistor MF10 or MF14 is independent on behavior $V_L$ vs. $V_{REF}$ only if $V_{REF}=Vdd/2$ and $V_L=Vdd/2$, and its value is zero. Its value is zero also if $(|V_L|-|V_{REF}|)>0$. Otherwise, if $(|V_L|-|V_{REF}|)<0$, the drain currents of MF10 and MF14 is non zero.

Due to operation of spill-over transistors MF5 and MF6, if a common voltage $V_{CV}=(V_L+V_{REF})/2$ exceeds Vdd/2, the branch including MOS transistors MF3, MF4, MF6, MF7, MF8, MF9 and MF10 is active; on the contrary, when the common voltage $V_{CV}$ is lower than Vdd/2, the branch including transistors MF1, MF2, MF11, MF12, MF13, MF14 and MF5 is active.

In the circuit of FIG. 6, there is a sort of "guard band" comprised between Vdd/2-Vg$_1$ and Vdd/2+Vg$_2$ intended to avoid distortion of the operation of amplifier 1, which is principally designed for audio applications. In fact, when $V_{REF}=V_L=0$ ($V_{CV}=0$), even small differences in the parameters of the circuit components (e.g. mismatch) could cause the drain current of transistors MF10 and MF14 to be non-zero, thus generating distortion. Distortion is caused by an unwanted operation of the feedback stage 5 with respect to the common voltage $V_{CV}$.

In the embodiment of FIG. 6, distortion is prevented by avoiding the intervention of the feedback stage 5 in presence of any mismatch.

The width of the above defined guard band depends on a lower guard voltage Vg1 and an upper guard voltage Vg2 which can be calculated as follows. The lower guard voltage Vg$_1$ depends on the ratio M between the transistors MF3 and MF6, the upper guard voltage Vg2 depends on the ratio M between the transistors MF1 and MF5. To obtain the value of the guard voltage Vg1, let's consider the worst case, when $I_D(MF4)=0$ and let's assume, for simplicity, that both MF3 and MF6 operate in the weak inversion region, and that the drain current of transistor MF10 is equal to zero. In such a situation, the drain current of transistor MF3 is equal to the drain current of transistor MF8.

If the aspect ratios W/L of transistors MF8 and MF7 have the same value, this causes:

$$I_D(MF3)=I_D(MF6), \quad (4)$$

wherein $I_D(MF3)$ and $I_D(MF6)$ represent the drain currents of MOS transistors MF3 and MF6 respectively.

From the equations describing the operation of MOS transistors in weak inverse condition, it is possible to obtain the value of Vg1 at which equation (3) the is true.

In fact, $$V_{g1} = V_{GS}(MF3) - V_{GS}(MF6)$$

Thus $$V_{g1} = V_T \ln \frac{(W/L)_{MF3}}{(W/L)_{MF6}}, \quad (5)$$

where $V_T$ is the thermal voltage $$V_T = \frac{k_B T}{q} \quad (6)$$

where $k_B$ is the Boltzmann constant, T represents the temperature expressed in Kelvin and q is the electron charge.

In the above described embodiments, where the aspect ratio of MF6 is double than the aspect ratio of MF3, $V_{g1}$=17.92 mV at 300° K.

On the other hand, if MOS transistors MF3 and MF6 operate in strong inversion region, the following is true:

$$V_{g1} = V_{th\_d\_MF3}\left(1 - \sqrt{\frac{\left(\frac{W}{L}\right)_3}{\left(\frac{W}{L}\right)_6}}\right) \quad (7)$$

wherein $V_{th\_d\_MF3}$ represents the strong inversion threshold distance voltage of transistor MF3 with respect to a threshold voltage $V_{th}$ of a MOS transistor ($V_{th\_d\_MF3}=V_{GS}-V_{th}$) and $(W/L)_3$ and $(W/L)_6$ represent the aspect ratios of transistors MF3 and MF6 respectively.

The same applies to the lower guard voltage $V_{g2}$ due to transistors MF1 and MF5.

As result of the 'guard band' the following condition applies:

$$I_D(MF10)=I_D(MF14)=0 \Leftrightarrow V_{REF} \in (V_A-V_{g2}, V_A+V_{g1})$$
$$\cap V_L \in (V_A-V_{g2}, V_A+V_{g1}) \quad (8)$$

Figure 7A:
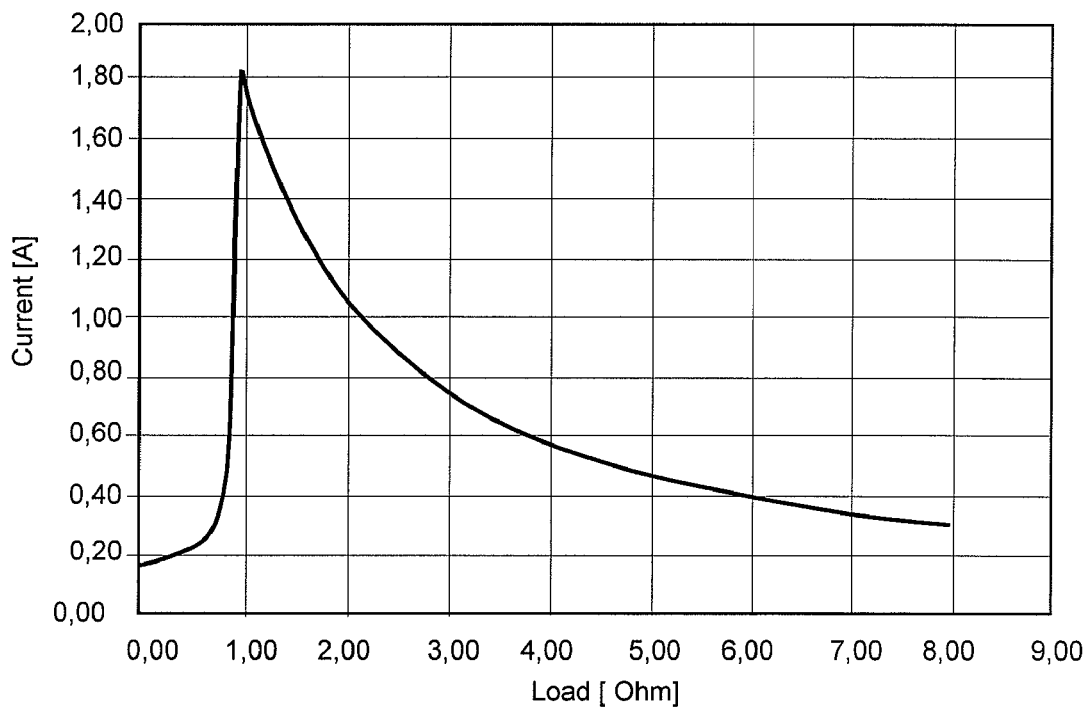
FIGS. 7a and 7b show the simulated characteristics output current versus output load in two different operative conditions.
Figure 7B:
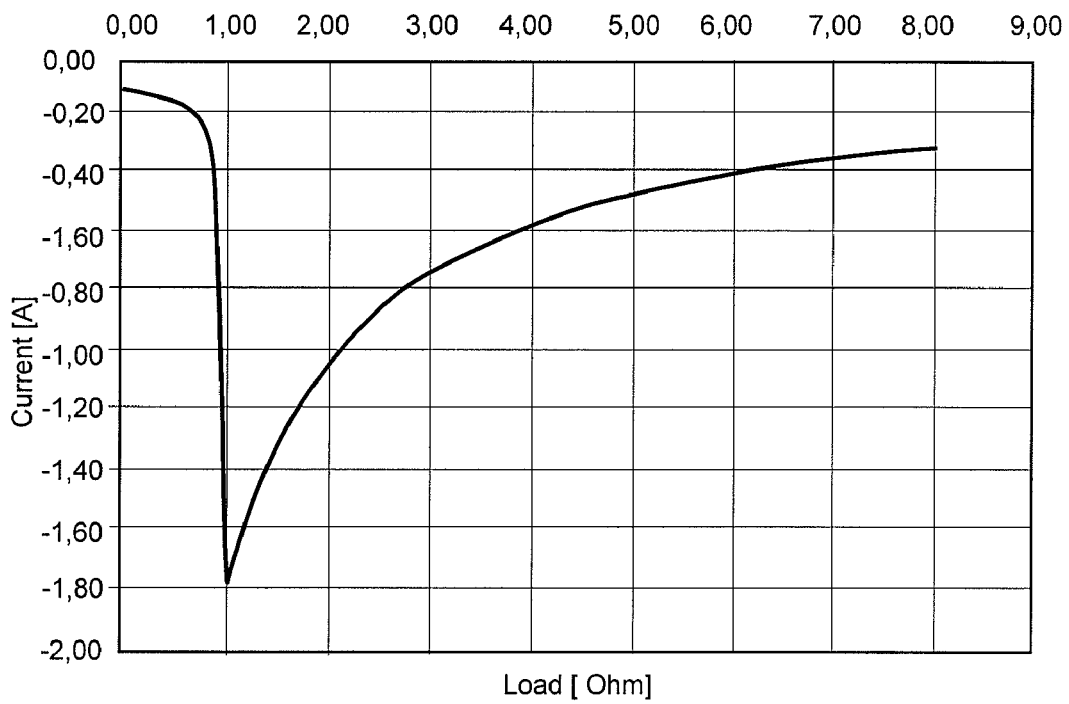
Figure 8A:
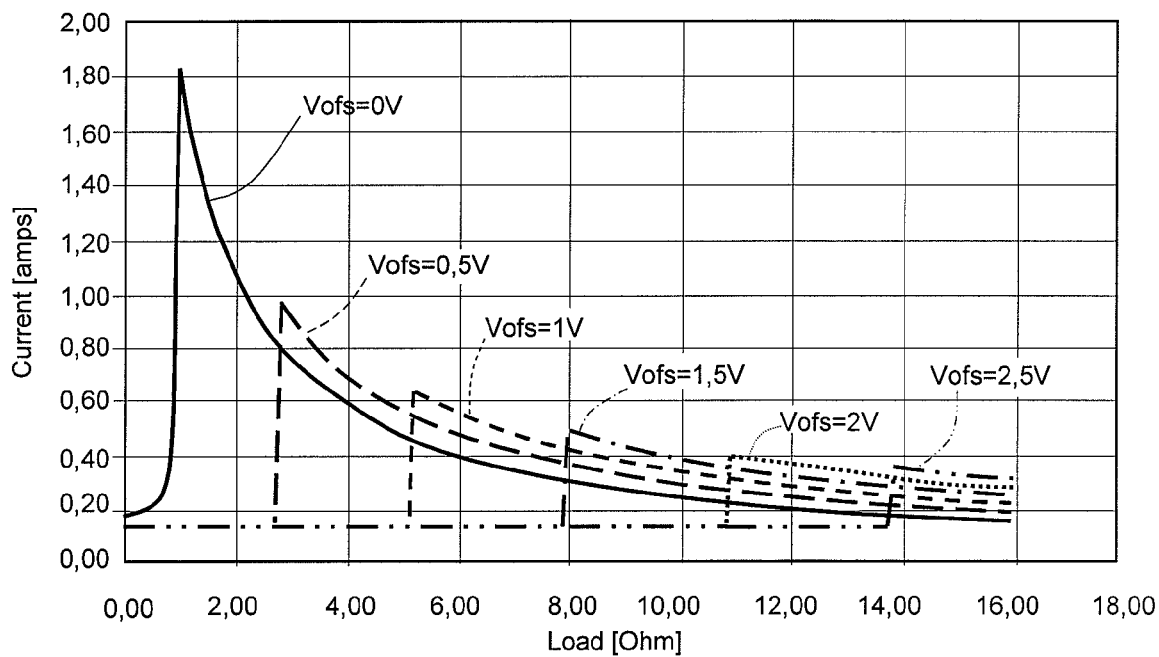
FIGS. 8a and 8b show the simulated characteristics output current versus output load in different operative conditions.
Figure 8B:
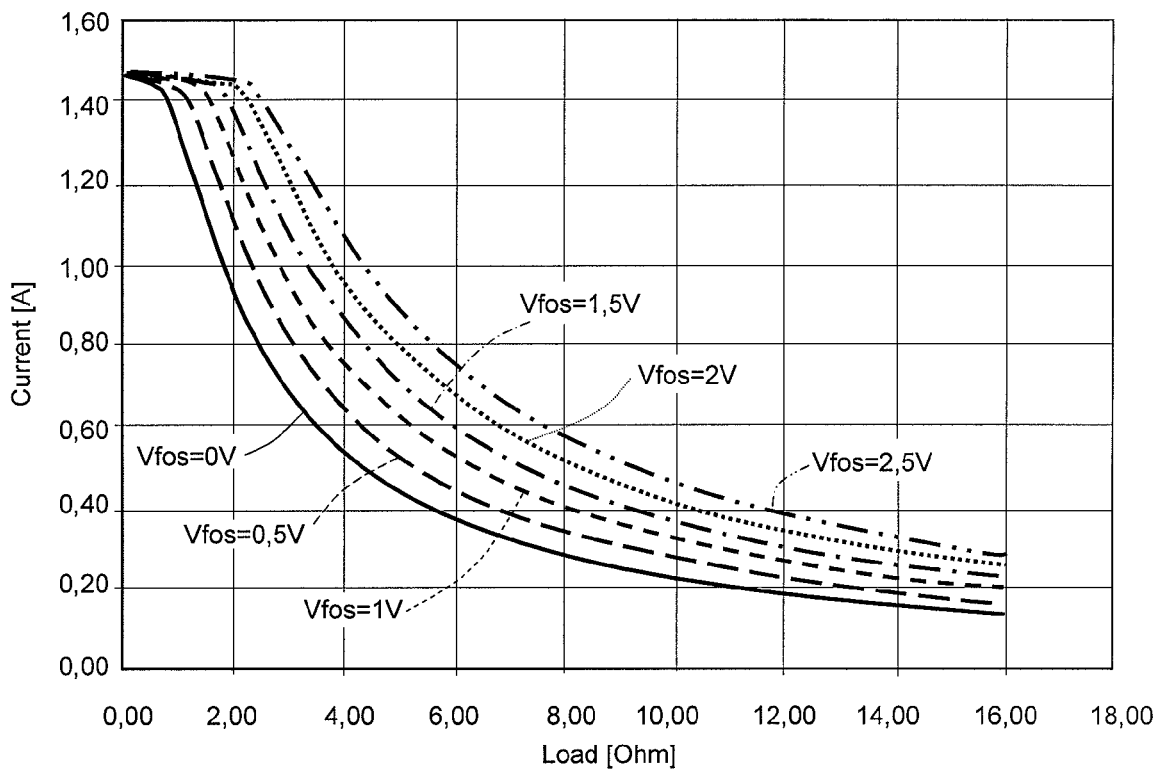

FIGS. 7a and 7b show the simulation results obtained from the circuit embodiment of FIG. 6, where the reduction in the output current according to the presence of potentially harmful load (here ≅1Ω) can be clearly seen. FIG. 8a and 8b show the output current characteristics when the reference load $R_{REF}$ is connected to different reference potentials, wherein $V_A$=Vdd/2+Vofs.

The advantages of the present invention are clear from the above description. In particular, it is stressed that the described operational amplifier prevents the arising of dangerous conditions by limiting both the current delivered to the output load and the power dissipation. Moreover, the circuit avoids the occurrence of distortion in the output signal, to be avoided in particular in audio applications.

The abrupt reduction of power dissipation is accomplished at even small reductions in the load resistance, thus approaching the ideal operation of a limitation circuit.

Finally, it is clear that numerous variations and modifications may be made to the amplifier as described and illustrated herein, all falling within the scope of the invention as defined in the attached claims. In particular, the specific values the circuit parameters, e.g. of the aspect ratio indicated above, are only exemplary and can be varied according to the specific requirements.

The described solution also applies to amplifiers of different type, not only to operational amplifiers, and to different application fields, not only audio circuits.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. An amplifier with output protection, comprising:
   an input stage defining a feedback node,
   an output stage connected to the feedback node and defining an output node supplying an output voltage of the amplifier,
   a feedback stage connected between the feedback node and the output node, and
   a mirror stage connected to the feedback node and having a same structure as the output stage, the mirror stage defining a reference node connected to the feedback stage for generating a reference voltage,
   wherein the feedback stage is configured to compare the output voltage to the reference voltage and generate a current limitation signal fed to said feedback node when the absolute value of the output voltage is less than the absolute value of the reference voltage.

2. An amplifier according to claim 1, wherein the feedback stage is a common voltage controlled operational amplifier.

3. An amplifier according to claim 1, wherein the output node is connected to an output load having a resistance and the mirror circuit is connected to a reference load having a resistance equal to a target minimum resistance of the output load.

4. An amplifier according to claim 3, wherein the output stage and the mirror stage comprise an output push-pull circuit and a reference push-pull circuit, respectively.

5. An amplifier according to claim 4, wherein each of the output push-pull circuit and reference push-pull circuit comprises an upper transistor and a lower transistor, wherein aspect ratios of the upper and lower transistors of the output push-pull circuit are higher than aspect ratios of the upper and lower transistors of the reference push-pull circuit.

6. An amplifier according to claim 1, wherein the feedback stage comprises first and second feedback differential stages, the first and second feedback differential stages each having a differential input connected to the output and reference nodes, and each of the first and second feedback differential stages having a differential output connected to the feedback node.

7. An amplifier according to claim 6, comprising a first plurality of mirror circuits connected between the differential output of the first feedback differential stage and the feedback node and a second plurality of minor circuits connected between the differential output of the second feedback differential stage and the feedback node, the first plurality of minor circuits comprising a first output transistor and the second plurality of minor circuits comprising a second output transistor, the first and the second output transistors being connected between first and second reference potential lines, respectively, and said feedback node.

8. An amplifier according to claim 7, wherein the first feedback differential stage comprises transistors of a first conductivity type and the second feedback differential stage comprises transistors of a second conductivity type, the first plurality of minor circuits being connected to the first reference potential line and the second plurality of minor circuits being connected to the second reference potential line.

9. An amplifier according to claim 7, wherein the first feedback differential stage comprises first and a second feedback transistors having respective output terminals connected to the first plurality of mirror circuits, wherein the second feedback differential stage comprises third and fourth feedback transistors having respective output terminals connected to the second plurality of mirror circuits, and wherein the feedback stage further comprises a first and a second spillover transistor each having a first and a second conduction terminal and a control terminal, the first spill-over transistor being connected in parallel to the second feedback transistor, the second spill-over transistor being connected in parallel to the fourth feedback transistor, and wherein the control terminals of the first and second spill-over transistors are connected to a third reference potential line, the first and second spillover transistors configured to switch off the first and second output transistors when the output voltage is in a voltage band centered on a reference voltage.

10. An amplifier according to claim 9, wherein the first plurality of mirror circuits comprises a fourth mirror circuit connected to the first feedback differential stage and the first spill-over transistor, and a third mirror circuit connected between the fourth mirror circuit and the feedback node, wherein the second plurality of mirror circuits comprises a second mirror circuit connected to the second feedback differential stage and the second spill-over transistor, and a first mirror circuit connected between the second mirror circuit and the feedback node, wherein the transistors of the second mirror circuit have a same aspect ratio as each other, wherein the transistors of the fourth mirror circuit have a same aspect ratio as each other, wherein the transistors of the second mirror circuit have a different aspect ratio with respect to the transistors of the fourth mirror circuit, and wherein the first and the second output transistors form part of the first and third mirror circuits, respectively, and have a higher aspect ratio than transistors of the first and third mirror circuits connected to the second and fourth mirror circuits.

11. An amplifier according to claim to 10, wherein the transistors of the first feedback differential stage have a same first aspect ratio, the transistors of the second differential stage have a second aspect ratio, the first and second feedback transistors of the first feedback differential stage having an aspect ratio which is one half of the aspect ratio of the first spill-over transistor, the third and fourth transistors of the second feedback differential stage having an aspect ratio which is one half of the aspect ratio of the second spill-over transistor.

12. An amplifier according to claim 1, wherein the feedback node corresponds to an output of the input stage.

13. An amplifier according to claim 1, wherein the output stage and feedback stage are configured to define a voltage guard band centered on a reference voltage and for which the feedback stage does not generate the current limitation signal.

14. A method of operating an amplifier circuit, the method comprising:
generating an output voltage to drive a load;
generating a reference voltage;
comparing the output voltage to the reference voltage;
determining, by the comparison of the output voltage to the reference voltage, that the absolute value of the output voltage is less than the absolute value of the reference voltage; and
reducing, in response to the determination, a current provided to the load,
wherein reducing the current provided to the load comprises generating a feedback signal and providing the feedback signal to circuitry providing the current to the load, and
wherein generating a feedback signal comprises generating a linear signal having a value dependent on a difference between the output voltage and the reference voltage.

15. A method of operating an amplifier circuit, the method comprising:
generating an output voltage to drive a load;
generating a reference voltage;
comparing the output voltage to the reference voltage;
determining, by the comparison of the output voltage to the reference voltage, that the absolute value of the output voltage is less than the absolute value of the reference voltage; and
reducing, in response to the determination, a current provided to the load,
wherein generating the output voltage comprises generating the output voltage using a first circuit having a first structure, and wherein generating the reference voltage comprises generating the reference voltage using a second circuit having the first structure.

16. The method of claim 15, wherein reducing the current provided to the load comprises eliminating the current provided to the load.

17. An amplifier, comprising:
an output stage configured to generate an output voltage to drive a load;
means for reducing an output current provided by the output stage in response to the absolute value of the output voltage being less than the absolute value of a reference voltage; and
an input stage coupled to an input of the output stage, the input stage having an output defining a feedback node, and wherein the means for reducing an output current comprises means for providing a current limitation signal to the feedback node;
wherein the means for reducing an output current further comprises means defining a voltage guard band centered on a reference voltage and for which the current limitation signal is not generated.

* * * * *